United States Patent
Lee et al.

(10) Patent No.: US 11,598,955 B2
(45) Date of Patent: Mar. 7, 2023

(54) SYSTEM AND METHOD OF OPERATING A DISPLAY OF AN INFORMATION HANDLING SYSTEM

(71) Applicant: Dell Products L.P., Round Rock, TX (US)

(72) Inventors: Jongseo Lee, Austin, TX (US); Asim Mukarram Siddiqui, Cedar Park, TX (US); Deeder M. Aurongzeb, Austin, TX (US)

(73) Assignee: Dell Products L.P., Round Rock, TX (US)

( * ) Notice: Subject to any disclaimer, the term of this patent is extended or adjusted under 35 U.S.C. 154(b) by 291 days.

(21) Appl. No.: 17/068,423

(22) Filed: Oct. 12, 2020

(65) Prior Publication Data
US 2022/0113537 A1 Apr. 14, 2022

(51) Int. Cl.
| | |
|---|---|
| *G09G 5/02* | (2006.01) |
| *G02B 27/00* | (2006.01) |
| *G06F 3/01* | (2006.01) |
| *G09G 3/3208* | (2016.01) |
| *G02F 1/137* | (2006.01) |
| *H01L 27/32* | (2006.01) |
| *H01L 51/52* | (2006.01) |

(52) U.S. Cl.
CPC ......... *G02B 27/0081* (2013.01); *G02F 1/137* (2013.01); *G06F 3/013* (2013.01); *G09G 3/3208* (2013.01); *H01L 27/3244* (2013.01); *H01L 27/3281* (2013.01); *H01L 51/5281* (2013.01); *G09G 2320/068* (2013.01); *G09G 2354/00* (2013.01); *G09G 2358/00* (2013.01)

(58) Field of Classification Search
CPC . G02B 27/0081; G02B 27/0093; G02F 1/137; G06F 3/013; G09G 3/3208; G09G 2320/068; G09G 2354/00; G09G 2358/00; H01L 27/3244; H01L 27/3281; H01L 51/5281; H04N 5/232
USPC .......................................... 345/694, 698, 699
See application file for complete search history.

(56) References Cited

U.S. PATENT DOCUMENTS

| | | | |
|---|---|---|---|
| 10,598,928 B1 * | 3/2020 | Lam | G06F 3/013 |
| 10,812,783 B1 * | 10/2020 | Peri | G02B 3/0068 |
| 10,859,838 B1 * | 12/2020 | Yoon | G06F 3/012 |
| 10,996,514 B1 * | 5/2021 | Richards | G02F 1/133603 |
| 2017/0186231 A1 * | 6/2017 | Petrov | G06F 3/0304 |
| 2017/0293146 A1 * | 10/2017 | Nicholls | G02B 27/0093 |
| 2018/0143354 A1 * | 5/2018 | Li | G09G 3/003 |

(Continued)

*Primary Examiner* — Thuy N Pardo
(74) *Attorney, Agent, or Firm* — McDermott Will & Emery LLP

(57) ABSTRACT

In one or more embodiments, one or more systems, one or more methods, and/or one or more processes may provide, by first multiple light emitting diode (LED) pixels of a display, first light emissions; provide, by second multiple LED pixels of the display, second light emissions; determine a gaze point associated with eyes of a user and associated with the display; and configure multiple liquid crystal display pixels of the display within a distance from the gaze point to: block the second light emissions to a first eye of the eyes of the user, block the first light emissions to a second eye of the eyes of the user, permit transmission of the first light emissions to the first eye of the eyes of the user, and permit transmission of the second light emissions to the second eye of the eyes of the user.

20 Claims, 10 Drawing Sheets

(56) References Cited

U.S. PATENT DOCUMENTS

| | | | |
|---|---|---|---|
| 2019/0004325 A1* | 1/2019 | Connor | G02B 27/0172 |
| 2019/0101767 A1* | 4/2019 | Geng | G06F 3/013 |
| 2019/0114996 A1* | 4/2019 | Lee | G09G 3/003 |
| 2019/0377176 A1* | 12/2019 | Sharp | G02B 27/0037 |
| 2020/0005719 A1* | 1/2020 | Martin | G06F 3/012 |
| 2020/0050851 A1* | 2/2020 | Cavin | G06V 10/141 |
| 2020/0143759 A1* | 5/2020 | Lee | G09G 3/36 |
| 2020/0200962 A1* | 6/2020 | Chen | G02B 6/0036 |
| 2020/0225748 A1* | 7/2020 | Gotsch | G06V 40/19 |
| 2022/0214746 A1* | 7/2022 | Bedard | G02B 17/0856 |

* cited by examiner

SYSTEM AND METHOD OF OPERATING A DISPLAY OF AN INFORMATION HANDLING SYSTEM

BACKGROUND

Field of the Disclosure

This disclosure relates generally to information handling systems and more particularly to operating a display of an information handling system.

Description of the Related Art

As the value and use of information continues to increase, individuals and businesses seek additional ways to process and store information. One option available to users is information handling systems. An information handling system generally processes, compiles, stores, and/or communicates information or data for business, personal, or other purposes thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems.

SUMMARY

In one or more embodiments, one or more systems, one or more methods, and/or one or more processes may provide, by first multiple light emitting diode (LED) pixels of a display of an information handling system, first light emissions; may provide, by second multiple LED pixels of the display, second light emissions; may determine a gaze point associated with eyes of a user of the information handling system and associated with the display; and may configure multiple liquid crystal display (LCD) pixels of the display within a distance from the gaze point to: block the second light emissions to a first eye of the eyes of the user, block the first light emissions to a second eye of the eyes of the user, permit transmission of the first light emissions to the first eye of the eyes of the user, and permit transmission of the second light emissions to the second eye of the eyes of the user.

In one or more embodiments, a first layer of the display may include the first multiple LED pixels and the second plurality of LED pixels. In one or more embodiments, a second layer of the display includes the multiple LCD pixels. In one or more embodiments, configuring the multiple LCD pixels may include establishing multiple light emission barriers that block the second light emissions to the first eye of the eyes of the user, block the first light emissions to the second eye of the eyes of the user, permit transmission of the first light emissions to the first eye of the eyes of the user, and permit transmission of the second light emissions to the second eye of the eyes of the user. In one or more embodiments, the one or more systems, the one or more methods, and/or the one or more processes may further determine a distance from the display to the eyes of the user and may further configure spacing distances between the multiple light emission barriers based at least on the distance from the display to the eyes of the user. In one or more embodiments, the second layer of the display may be at least six millimeters (6 mm) thick.

In one or more embodiments, the first multiple LED pixels may include first multiple organic light emitting diode (OLED) pixels, and the second multiple LED pixels may include second multiple OLED pixels. For example, the first multiple OLED pixels and the second multiple OLED pixels may be addressed via passive matrix addressing or via active matrix addressing. In one or more embodiments, the first light emissions may be polarized at a first angle, and the second light emissions may be polarized at the first angle. In one or more embodiments, the first multiple LCD pixels may be configured to polarize the first light emissions at a second angle, the second multiple LCD pixels may be configured to polarize the second light emissions at the second angle.

BRIEF DESCRIPTION OF THE DRAWINGS

For a more complete understanding of the present disclosure and its features/advantages, reference is now made to the following description, taken in conjunction with the accompanying drawings, which are not drawn to scale, and in which.

DETAILED DESCRIPTION

Figure 1A:
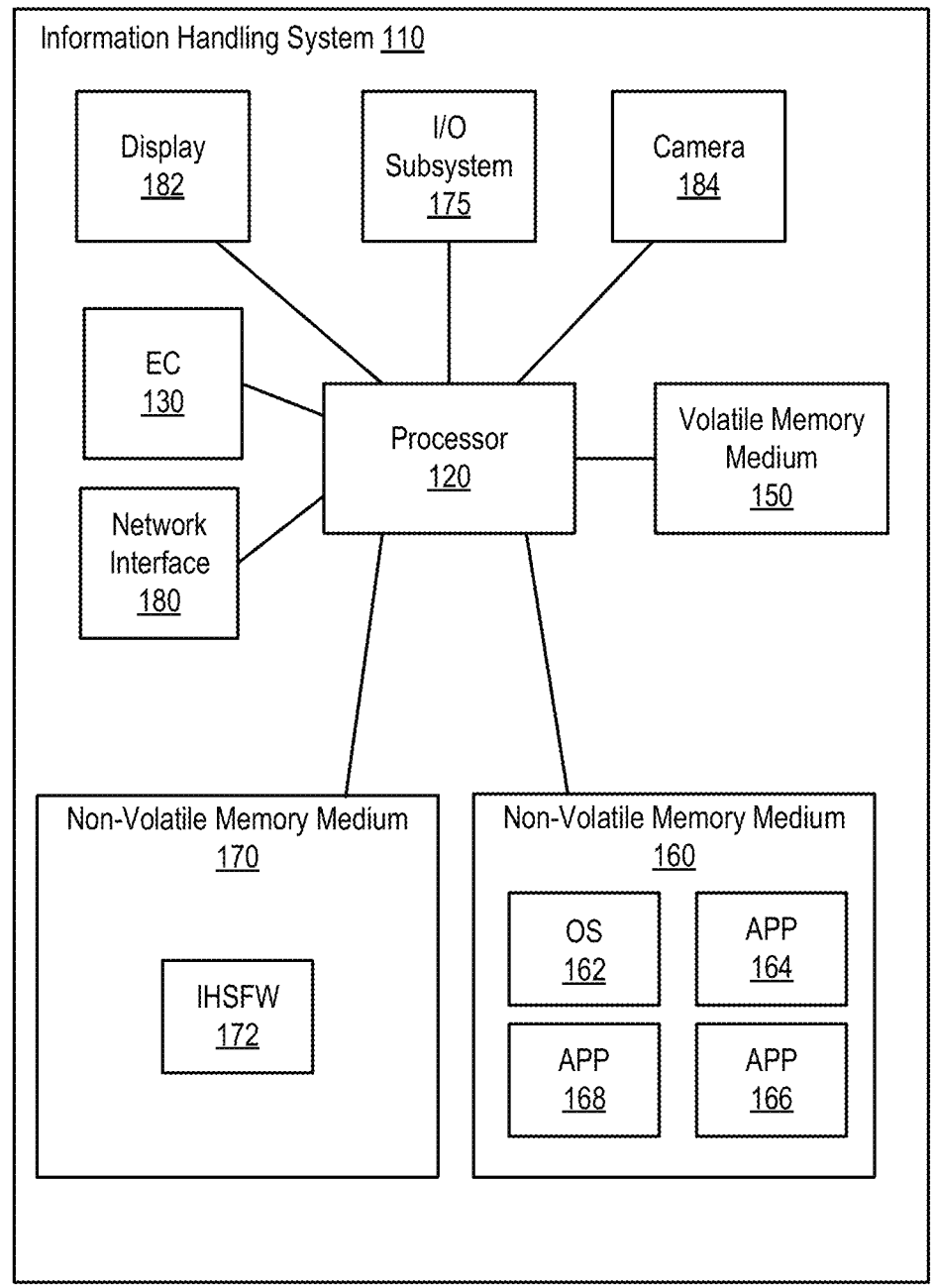
FIG. 1A illustrates an example of an information handling system, according to one or more embodiments.

In the following description, details are set forth by way of example to facilitate discussion of the disclosed subject matter. It should be apparent to a person of ordinary skill in the field, however, that the disclosed embodiments are examples and not exhaustive of all possible embodiments.

As used herein, a reference numeral refers to a class or type of entity, and any letter following such reference numeral refers to a specific instance of a particular entity of that class or type. Thus, for example, a hypothetical entity referenced by '12A' may refer to a particular instance of a particular class/type, and the reference '12' may refer to a collection of instances belonging to that particular class/type or any one instance of that class/type in general.

In one or more embodiments, a display of an information handling system may provide privacy of content being displayed. For example, a viewing angle may be reduced, which may mitigate or prevent others from viewing content displayed via the display. In one or more embodiments, a parallax barrier optical switching cell may be utilized to control light emissions from the display. For example, the display may include multiple organic light emitting diodes (OLEDs). For instance, a parallax barrier optical switching cell may be utilized to control light emissions the OLEDs of the display. In one or more embodiments, a parallax barrier optical switching cell may be engaged to establish a display privacy mode or may be disengaged to establish a display-sharing mode.

In one or more embodiments, a parallax barrier optical switching cell may be associated with a thickness. For example, the thickness may be up to six millimeters (6 mm). For instance, at one or more viewing angles, content of the display (e.g., glyphs, text, graphics, etc.) may not be seen correctly as the content may be distorted. In one or more embodiments, content displayed by a display may be controlled via one or more stereoscopic views by providing a first image to a left eye of a user (e.g., a person) and providing a second image to a right eye of the user. For example, first pixels of the display may display the first image, and second pixels of the display may display the second image. In one instance, parallax barriers may prevent light emissions from the first pixels to be provided to the left eye of the user. In another instance, the parallax barriers may prevent light emissions from the second pixels to be provided to the right eye of the user. In one or more embodiments, an eye tracking system may be utilized to control one or more features of privately displaying content to the user. In one example, the eye tracking system may include a camera. For instance, the camera may be utilized to determine where the eyes of the user are focused on the display. In another example, the eye tracking system may include an eye tracking device. For instance, the eye tracking device may be utilized to determine where the eyes of the user are focused on the display.

Turning now to FIG. 1A, an example of an information handling system is illustrated, according to one or more embodiments. An information handling system (IHS) 110 may include a hardware resource or an aggregate of hardware resources operable to compute, classify, process, transmit, receive, retrieve, originate, switch, store, display, manifest, detect, record, reproduce, handle, and/or utilize various forms of information, intelligence, or data for business, scientific, control, entertainment, or other purposes, according to one or more embodiments. For example, IHS 110 may be a personal computer, a desktop computer system, a laptop computer system, a server computer system, a mobile device, a tablet computing device, a personal digital assistant (PDA), a consumer electronic device, an electronic music player, an electronic camera, an electronic video player, a wireless access point, a network storage device, or another suitable device and may vary in size, shape, performance, functionality, and price. In one or more embodiments, a portable IHS 110 may include or have a form factor of that of or similar to one or more of a laptop, a notebook, a telephone, a tablet, and a PDA, among others. For example, a portable IHS 110 may be readily carried and/or transported by a user (e.g., a person). In one or more embodiments, components of IHS 110 may include one or more storage devices, one or more communications ports for communicating with external devices as well as various input and output (I/O) devices, such as a keyboard, a mouse, and a video display, among others. In one or more embodiments, IHS 110 may include one or more buses operable to transmit communication between or among two or more hardware components. In one example, a bus of IHS 110 may include one or more of a memory bus, a peripheral bus, and a local bus, among others. In another example, a bus of IHS 110 may include one or more of a Micro Channel Architecture (MCA) bus, an Industry Standard Architecture (ISA) bus, an Enhanced ISA (EISA) bus, a Peripheral Component Interconnect (PCI) bus, HyperTransport (HT) bus, an inter-integrated circuit ($I^2C$) bus, a serial peripheral interface (SPI) bus, a low pin count (LPC) bus, an enhanced serial peripheral interface (eSPI) bus, a universal serial bus (USB), a system management bus (SMBus), and a Video Electronics Standards Association (VESA) local bus, among others.

In one or more embodiments, IHS 110 may include firmware that controls and/or communicates with one or more hard drives, network circuitry, one or more memory devices, one or more I/O devices, and/or one or more other peripheral devices. For example, firmware may include software embedded in an IHS component utilized to perform tasks. In one or more embodiments, firmware may be stored in non-volatile memory, such as storage that does not lose stored data upon loss of power. In one example, firmware associated with an IHS component may be stored in non-volatile memory that is accessible to one or more IHS components. In another example, firmware associated with an IHS component may be stored in non-volatile memory that may be dedicated to and includes part of that component. For instance, an embedded controller may include firmware that may be stored via non-volatile memory that may be dedicated to and includes part of the embedded controller.

As shown, IHS 110 may include a processor 120, an embedded controller (EC) 130, a volatile memory medium 150, non-volatile memory media 160 and 170, an I/O subsystem 175, a network interface 180, a display 182, and a camera 184. As illustrated, EC 130, volatile memory medium 150, non-volatile memory media 160 and 170, I/O subsystem 175, network interface 180, display 182, and camera 184 may be communicatively coupled to processor 120.

In one or more embodiments, one or more of EC 130, volatile memory medium 150, non-volatile memory media 160 and 170, I/O subsystem 175, network interface 180, display 182, and camera 184 may be communicatively coupled to processor 120 via one or more buses, one or more switches, and/or one or more root complexes, among others. In one example, one or more of EC 130, volatile memory medium 150, non-volatile memory media 160 and 170, I/O subsystem 175, network interface 180, display 182, and camera 184 may be communicatively coupled to processor 120 via one or more PCI-Express (PCIe) root complexes. In another example, one or more of I/O EC 130, subsystem 175, network interface 180, display 182, and camera 184 may be communicatively coupled to processor 120 via one or more PCIe switches.

In one or more embodiments, the term "memory medium" may mean a "storage device", a "memory", a "memory device", a "tangible computer readable storage medium", and/or a "computer-readable medium". For example, computer-readable media may include, without limitation, storage media such as a direct access storage device (e.g., a hard disk drive, a floppy disk, etc.), a sequential access storage device (e.g., a tape disk drive), a compact disk (CD), a CD-ROM, a digital versatile disc (DVD), a random access memory (RAM), a read-only memory (ROM), a one-time programmable (OTP) memory, an electrically erasable programmable read-only memory (EEPROM), and/or a flash memory, a solid state drive (SSD), or any combination of the foregoing, among others.

In one or more embodiments, one or more protocols may be utilized in transferring data to and/or from a memory medium. For example, the one or more protocols may include one or more of small computer system interface (SCSI), Serial Attached SCSI (SAS) or another transport that operates with the SCSI protocol, advanced technology attachment (ATA), serial ATA (SATA), a USB interface, an Institute of Electrical and Electronics Engineers (IEEE) 1394 interface, a Thunderbolt interface, an advanced technology attachment packet interface (ATAPI), serial storage architecture (SSA), integrated drive electronics (IDE), or any combination thereof, among others.

Volatile memory medium 150 may include volatile storage such as, for example, RAM, DRAM (dynamic RAM), EDO RAM (extended data out RAM), SRAM (static RAM), etc. One or more of non-volatile memory media 160 and 170 may include nonvolatile storage such as, for example, a read only memory (ROM), a programmable ROM (PROM), an erasable PROM (EPROM), an electrically erasable PROM, NVRAM (non-volatile RAM), ferroelectric RAM (FRAM), a magnetic medium (e.g., a hard drive, a floppy disk, a magnetic tape, etc.), optical storage (e.g., a CD, a DVD, a BLU-RAY disc, etc.), flash memory, a SSD, etc. In one or more embodiments, a memory medium can include one or more volatile storages and/or one or more nonvolatile storages.

In one or more embodiments, network interface 180 may be utilized in communicating with one or more networks and/or one or more other information handling systems. In one example, network interface 180 may enable IHS 110 to communicate via a network utilizing a suitable transmission protocol and/or standard. In a second example, network interface 180 may be coupled to a wired network. In a third example, network interface 180 may be coupled to an optical network. In another example, network interface 180 may be coupled to a wireless network. In one instance, the wireless network may include a cellular telephone network. In a second instance, the wireless network may include a satellite telephone network. In another instance, the wireless network may include a wireless Ethernet network (e.g., a Wi-Fi network, an IEEE 802.11 network, etc.).

In one or more embodiments, network interface 180 may be communicatively coupled via a network to a network storage resource. For example, the network may be implemented as, or may be a part of, a storage area network (SAN), personal area network (PAN), local area network (LAN), a metropolitan area network (MAN), a wide area network (WAN), a wireless local area network (WLAN), a virtual private network (VPN), an intranet, an Internet or another appropriate architecture or system that facilitates the communication of signals, data and/or messages (generally referred to as data). For instance, the network may transmit data utilizing a desired storage and/or communication protocol, including one or more of Fibre Channel, Frame Relay, Asynchronous Transfer Mode (ATM), Internet protocol (IP), other packet-based protocol, Internet SCSI (iSCSI), or any combination thereof, among others.

In one or more embodiments, processor 120 may execute processor instructions in implementing at least a portion of one or more systems, at least a portion of one or more flowcharts, at least a portion of one or more methods, and/or at least a portion of one or more processes described herein. In one example, processor 120 may execute processor instructions from one or more of memory media 150, 160, and 170 in implementing at least a portion of one or more systems, at least a portion of one or more flowcharts, at least a portion of one or more methods, and/or at least a portion of one or more processes described herein. In another example, processor 120 may execute processor instructions via network interface 180 in implementing at least a portion of one or more systems, at least a portion of one or more flowcharts, at least a portion of one or more methods, and/or at least a portion of one or more processes described herein.

In one or more embodiments, processor 120 may include one or more of a system, a device, and an apparatus operable to interpret and/or execute program instructions and/or process data, among others, and may include one or more of a microprocessor, a microcontroller, a digital signal processor (DSP), an application specific integrated circuit (ASIC), and another digital or analog circuitry configured to interpret and/or execute program instructions and/or process data, among others. In one example, processor 120 may interpret and/or execute program instructions and/or process data stored locally (e.g., via memory media 150, 160, and 170 and/or another component of IHS 110). In another example, processor 120 may interpret and/or execute program instructions and/or process data stored remotely (e.g., via a network storage resource).

In one or more embodiments, I/O subsystem 175 may represent a variety of communication interfaces, graphics interfaces, video interfaces, user input interfaces, and/or peripheral interfaces, among others. For example, PO subsystem 175 may include one or more of a touch panel and a display adapter, among others. For instance, a touch panel may include circuitry that enables touch functionality in conjunction with a display that is driven by a display adapter.

As shown, non-volatile memory medium 160 may include an operating system (OS) 162, and applications (APPs) 164-168. In one or more embodiments, one or more of OS 162 and APPs 164-168 may include processor instructions executable by processor 120. In one example, processor 120 may execute processor instructions of one or more of OS 162 and APPs 164-168 via non-volatile memory medium 160. In another example, one or more portions of the processor instructions of the one or more of OS 162 and APPs 164-168 may be transferred to volatile memory medium 150, and processor 120 may execute the one or more portions of the processor instructions of the one or more of OS 162 and APPs 164-168 via volatile memory medium 150.

As illustrated, non-volatile memory medium 170 may include information handling system firmware (IHSFW) 172. In one or more embodiments, IHSFW 172 may include processor instructions executable by processor 120. For example, IHSFW 172 may include one or more structures and/or one or more functionalities of and/or compliant with one or more of a basic input/output system (BIOS), an Extensible Firmware Interface (EFI), a Unified Extensible Firmware Interface (UEFI), and an Advanced Configuration and Power Interface (ACPI), among others. In one instance, processor 120 may execute processor instructions of IHSFW 172 via non-volatile memory medium 170. In another instance, one or more portions of the processor instructions of IHSFW 172 may be transferred to volatile memory medium 150, and processor 120 may execute the one or more portions of the processor instructions of IHSFW 172 via volatile memory medium 150.

In one or more embodiments, processor 120 and one or more components of IHS 110 may be included in a system-on-chip (SoC). For example, the SoC may include processor 120 and a platform controller hub (not specifically illustrated).

In one or more embodiments, EC 130 may be or include a remote access controller. For example, the remote access controller may be or include a DELL™ Remote Access Controller (DRAC). In one or more embodiments, a remote access controller may be integrated into IHS 110. For example, the remote access controller may be or include an integrated DELL™ Remote Access Controller (iDRAC). In one or more embodiments, a remote access controller may include one or more of a processor, a memory, and a network interface, among others. In one or more embodiments, a remote access controller may access one or more busses and/or one or more portions of IHS 110. For example, the remote access controller may include and/or may provide power management, virtual media access, and/or remote console capabilities, among others, which may be available via a web browser and/or a command line interface. For instance, the remote access controller may provide and/or permit an administrator (e.g., a user) one or more abilities to configure and/or maintain an information handling system as if the administrator was at a console of the information handling system and/or had physical access to the information handling system.

In one or more embodiments, a remote access controller may interface with baseboard management controller integrated circuits. In one example, the remote access controller may be based at least on an Intelligent Platform Management Interface (IPMI) standard. For instance, the remote access controller may allow and/or permit utilization of IPMI out-of-band interfaces such as IPMI Over LAN (local area network). In another example, the remote access controller may be based at least on a Redfish standard. In one instance, one or more portions of the remote access controller may be compliant with one or more portions of a Redfish standard. In another instance, one or more portions of the remote access controller may implement one or more portions of a Redfish standard. In one or more embodiments, a remote access controller may include and/or provide one or more internal private networks. For example, the remote access controller may include and/or provide one or more of an Ethernet interface, a front panel USB interface, and a Wi-Fi interface, among others. In one or more embodiments, a remote access controller may be, include, or form at least a portion of a virtual KVM (keyboard, video, and mouse) device. For example, a remote access controller may be, include, or form at least a portion of a KVM over IP (IPKVM) device. For instance, a remote access controller may capture video, keyboard, and/or mouse signals; may convert the signals into packets; and may provide the packets to a remote console application via a network.

In one or more embodiments, EC 130 may be or include a microcontroller. For example, the microcontroller may be or include an 8051 microcontroller, an ARM Cortex-M (e.g., Cortex-M0, Cortex-M1, Cortex-M3, Cortex-M4, Cortex-M7, etc.) microcontroller, a MSP430 microcontroller, an AVR (e.g., 8-bit AVR, AVR-32, etc.) microcontroller, a PIC microcontroller, a 68HC11 microcontroller, a ColdFire microcontroller, and a Renesas microcontroller, among others. In one or more embodiments, EC 130 may be or include an application processor. In one example, EC 130 may be or include an ARM Cortex-A processor. In another example, EC 130 may be or include an Intel Atom processor. In one or more embodiments, EC 130 may be or include one or more of a field programmable gate array (FPGA) and an ASIC, among others, configured, coded, and/or encoded with instructions in accordance with at least a portion of one or more of systems, at least a portion of one or more flowcharts, at least a portion of one or more methods, and/or at least a portion of one or more processes described herein.

Figure 1B:
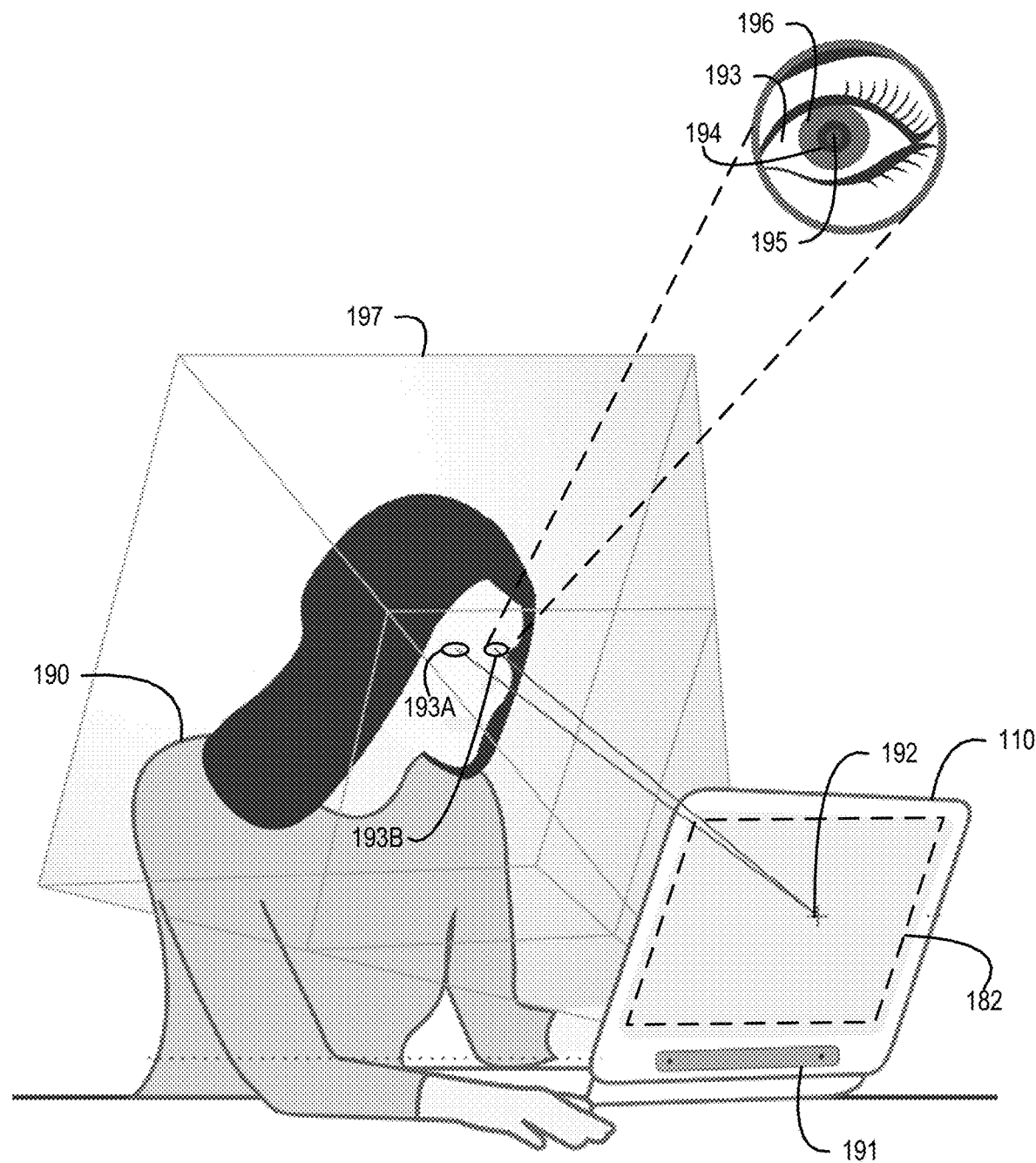
FIG. 1B illustrates an example of a user utilizing an information handling system, according to one or more embodiments.

Turning now to FIG. 1B, an example of a user utilizing an information handling system is illustrated, according to one or more embodiments. As shown, a user 190 may utilize IHS 110. As illustrated, IHS 110 may include an eye tracking device 191. Although not specifically illustrated, eye tracking device 191 may be communicatively coupled to one or more of processor 120 and EC 130, among others, according to one or more embodiments. In one or more embodiments, one or more of camera 184 and eye tracking device 191, among others, may track eyes 193A and 193B of user 190. In one example, one or more of camera 184 and eye tracking device 191, among others, may track a pupil 194 of an eye 193. In a second example, one or more of camera 184 and eye tracking device 191, among others, may track a center 195 of a pupil 194 of an eye 193. In another example, one or more of camera 184 and eye tracking device 191, among others, may track an iris 196 of an eye 193.

In one or more embodiments, one or more of eyes 193A and 193B may be illuminated. For example, IHS 110 may provide light emissions to the one or more of eyes 193A and 193B to illuminate the one or more of eyes 193A and 193B. For instance, the light emissions provided to the one or more of eyes 193A and 193B may be outside a visible spectrum of the one or more of eyes 193A and 193B. As an example, the light emissions provided to the one or more of eyes 193A and 193B may be infrared light emissions. For instance, one or more light emitting diodes (LEDs) may provide the infrared light emissions. In one or more embodiments, IHS 110 may include the one or more LEDs that may provide the infrared light emissions.

In one or more embodiments, one or more of camera 184 and eye tracking device 191, among others, may determine a gaze point 192. For example, gaze point 192 may indicate where one or more of eyes 193A and 193B may be focused on display 182. In one or more embodiments, if an eye 193 is within a viewing volume 197, eye 193 may be able to perceive glyphs, text, and/or graphics displayed via display 182. If an eye 193 is not within viewing volume 197, eye 193 may not be able to perceive glyphs, text, and/or graphics displayed via display 182. For example, one or more systems, one or more methods, and/or one or more processes described herein may provide privacy of information displayed via display 182 when one or more of eyes 193A and 193B are within viewing volume 197. In one or more embodiments, viewing volume 197 may be referred to as a head box.

Figure 2:
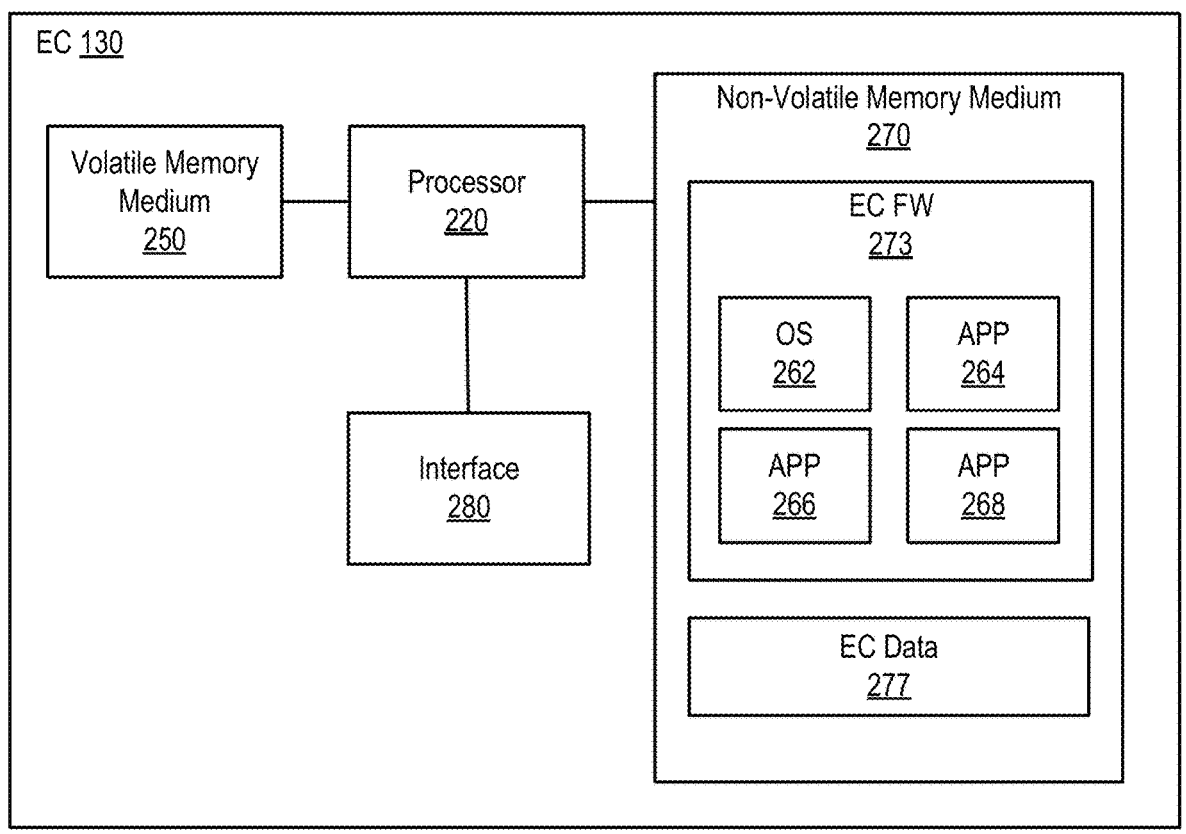
FIG. 2 illustrates an example of an embedded controller, according to one or more embodiments.

Turning now to FIG. 2, an example of an embedded controller is illustrated, according to one or more embodiments. As shown, EC 130 may include a processor 220, a volatile memory medium 250, a non-volatile memory medium 270, and an interface 280. As illustrated, non-volatile memory medium 270 may include a EC firmware (FW) 273, which may include an OS 262 and APPs 264-268, and may include EC data 277. In one example, OS 262 may be or include a real-time operating system (RTOS). For instance, the RTOS may be or include FreeRTOS, OpenRTOS, SafeRTOS, QNX, ThreadX, VxWorks, NuttX, TI-RTOS, eCos, MicroC/OS, or Zephyr, among others. In a second example, OS 262 may be or include an Unix-like operating system. For instance, the Unix-like operating system may be or include LINUX®, FREEBSD®, NETBSD®, OpenBSD, Minix, Xinu, or Darwin, among others. In another example, OS 262 may be or include a portable operating system interface (POSIX) compliant operating system.

In one or more embodiments, interface 280 may include circuitry that enables communicatively coupling to one or more devices. In one example, interface 280 may include circuitry that enables communicatively coupling to one or more buses. For instance, the one or more buses may include one or more buses described herein, among others. In a second example, interface 280 may include circuitry that enables one or more interrupt signals to be received. In one instance, interface 280 may include general purpose input/output (GPIO) circuitry, and the GPIO circuitry may enable one or more interrupt signals to be received and/or provided via at least one interrupt line. In another instance, interface 280 may include GPIO circuitry that may enable EC 130 to provide and/or receive signals associated with other circuitry (e.g., diagnostic circuitry, etc.). In a third example, interface 280 may include circuitry that enables communicatively coupling to one or more networks. In one instance, interface 280 may include circuitry that enables communicatively coupling to network interface 180. In another example, interface 280 may include a network interface.

In one or more embodiments, one or more of OS 262 and APPs 264-268 may include processor instructions executable by processor 220. In one example, processor 220 may execute processor instructions of one or more of OS 262 and APPs 264-268 via non-volatile memory medium 270. In another example, one or more portions of the processor instructions of the one or more of OS 262 and APPs 264-268 may be transferred to volatile memory medium 250, and processor 220 may execute the one or more portions of the processor instructions of the one or more of OS 262 and APPs 264-268 via volatile memory medium 250. In one or more embodiments, processor 220 may execute instructions in accordance with at least a portion of one or more systems, at least a portion of one or more flowcharts, one or more methods, and/or at least a portion of one or more processes described herein. For example, non-volatile memory medium 270 and/or volatile memory medium 250 may store instructions that may be executable in accordance with at least a portion of one or more systems, at least a portion of one or more flowcharts, at least a portion of one or more methods, and/or at least a portion of one or more processes described herein. In one or more embodiments, processor 220 may execute instructions in accordance with at least a portion of one or more of systems, flowcharts, at least a portion of one or more methods, and/or at least a portion of one or more processes described herein. For example, non-volatile memory medium 270 and/or volatile memory medium 250 may store instructions that may be executable in accordance with at least a portion of one or more systems, at least a portion of one or more flowcharts, at least a portion of one or more methods, and/or at least a portion of one or more processes described herein. In one or more embodiments, processor 220 may utilize EC data 277. In one example, processor 220 may utilize EC data 277 via non-volatile memory medium 270. In another example, one or more portions of EC data 277 may be transferred to volatile memory medium 250, and processor 220 may utilize EC data 277 via volatile memory medium 250.

Figure 3A:
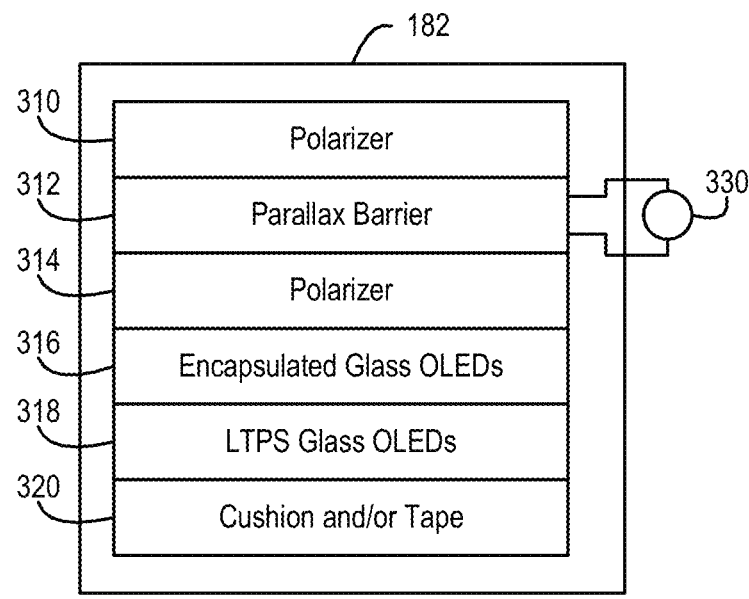
FIG. 3A illustrates an example of a display, according to one or more embodiments.

Turning now to FIG. 3A, an example of a display is illustrated, according to one or more embodiments. As shown, display 182 may include layers 310-316, 318, and 320. As illustrated, layer 310 may include a polarizer. As shown, layer 312 may include a parallax barrier. As illustrated, a voltage source 330 may be coupled to layer 312. For example, voltage source 330 may be utilized to control one or more liquid crystal displays (LCDs) of layer 312. For instance, the one or more LCDs of layer 312 may establish and/or implement one or more barriers. In one or more embodiments, a liquid crystal display (LCD) of layer 312 may include multiple LCD pixels. In one or more embodiments, display 182 may include voltage source 330, or voltage source 330 may be external to display 182.

As shown, layer 314 may include another polarizer. As illustrated, layer 316 may include encapsulated glass OLEDs. As shown, layer 318 may include low temperature polysilicon (LTPS) glass OLEDs. As illustrated, layer 320 may include a cushion and/or tape.

Figure 3B:
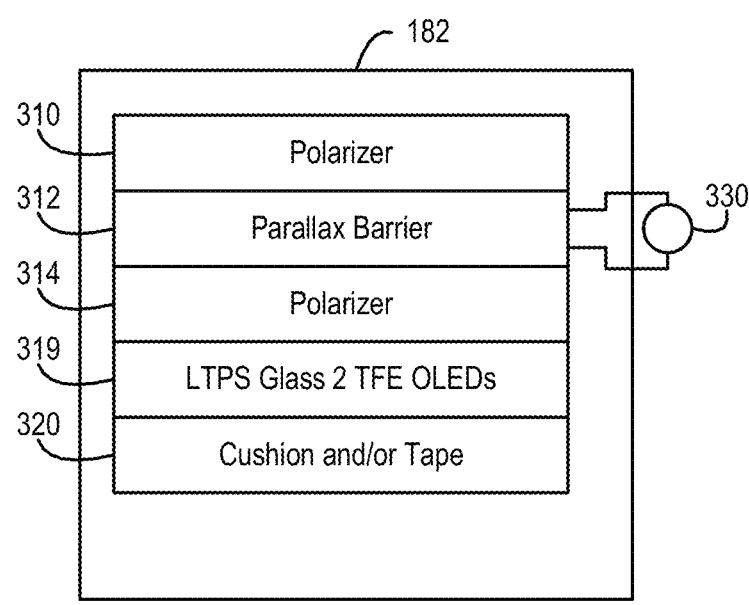
FIG. 3B illustrates another example of a display, according to one or more embodiments.

Turning now to FIG. 3B, another example of a display is illustrated, according to one or more embodiments. As shown, display 182 may include layers 310-314, 319, and 320. In one or more embodiments, layers 310-314, and 320 may include elements as those described with reference to FIG. 3A. As illustrated, layer 319 may include low temperature polysilicon (LTPS) and thin filament encapsulation (TFE) OLEDs.

Figure 4A:
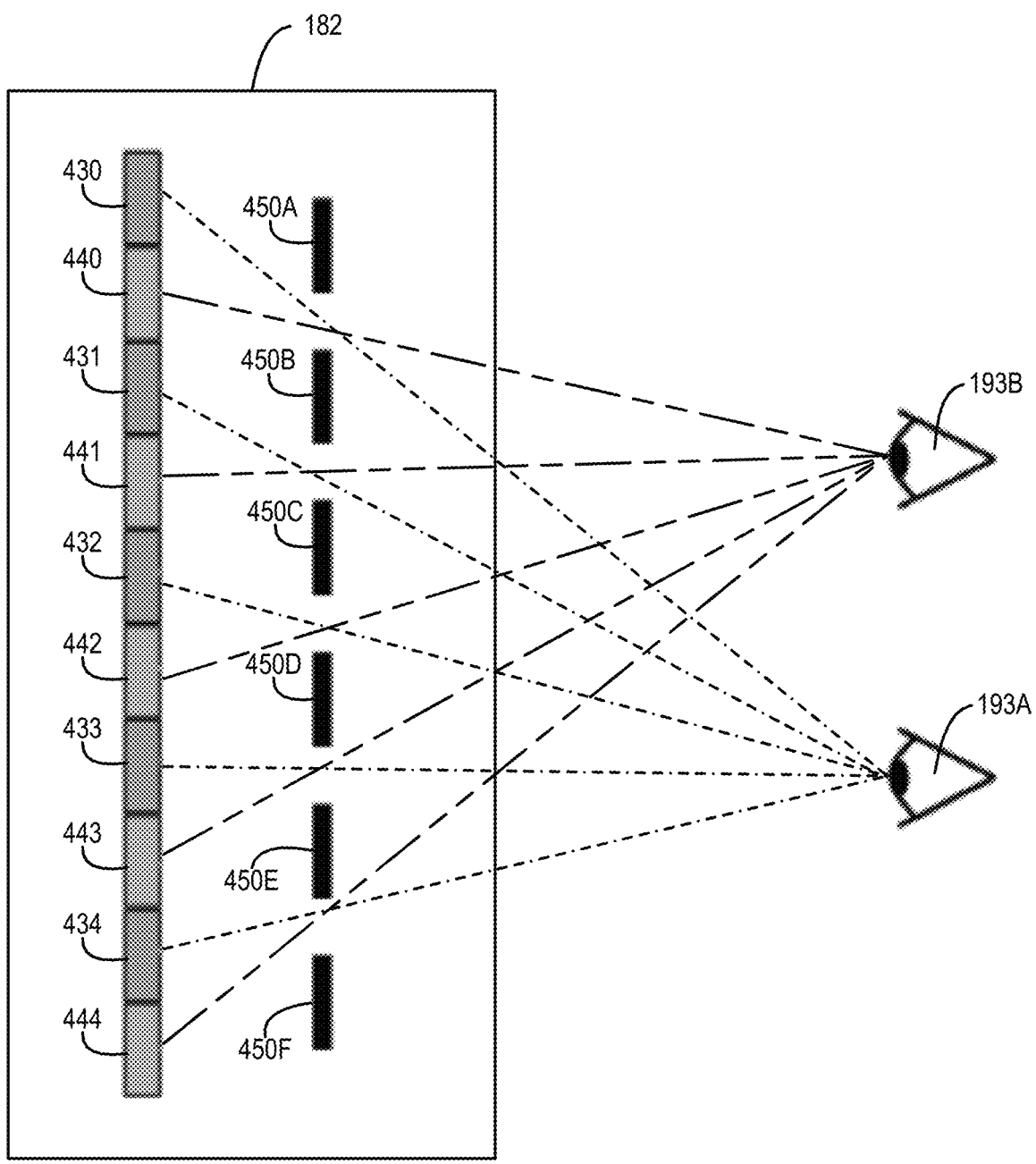
FIG. 4A illustrates an example of light-providing pixels and light barriers, according to one or more embodiments.

Turning now to FIG. 4A, an example of light-providing pixels and light barriers is illustrated, according to one or more embodiments. As shown, display 482 may include pixels 430-444. For example, pixels 430-434 may provide light emissions to eyes 193A and 193B of user 190. In one instance, pixels 430-434 may provide first light emissions. In another instance, pixels 440-444 may provide second light emissions. In one or more embodiments, layer 318 may include pixels 430-444. In one or more embodiments, layer 319 may include pixels 430-444. In one or more embodiments, each of pixels 430-444 may include one or more OLEDs.

As illustrated, display 482 may include barriers 450A-450F. In one or more embodiments, a barrier 450 may be established by one or more LCD pixels. In one example, a barrier 450 may block light emissions from one or more of pixels 430-434. For instance, a barrier 450 may block the first light emissions from eye 193B. In another example, a barrier 450 may block light emissions from one or more of pixels 440-444. For instance, a barrier 450 may block the second light emissions from eye 193A. As an example, space between one or more of barriers 450A-450F may permit the first light emissions to eye 193A. As another example, one or more of barriers 450A-450F may permit the second light emissions to eye 193B. In one or more embodiments, layer 312 may include LCD pixels. For example, layer 312 may include barriers 450A-450F.

Figure 4B:
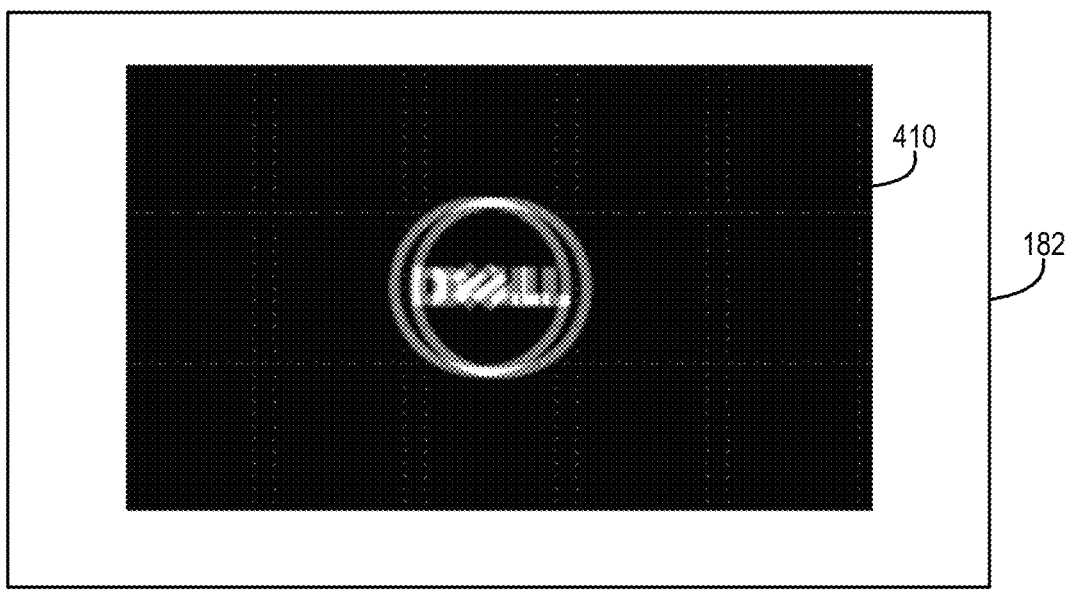
FIG. 4B illustrates an example of a display displaying a distorted image, according to one or more embodiments.
Figure 4C:
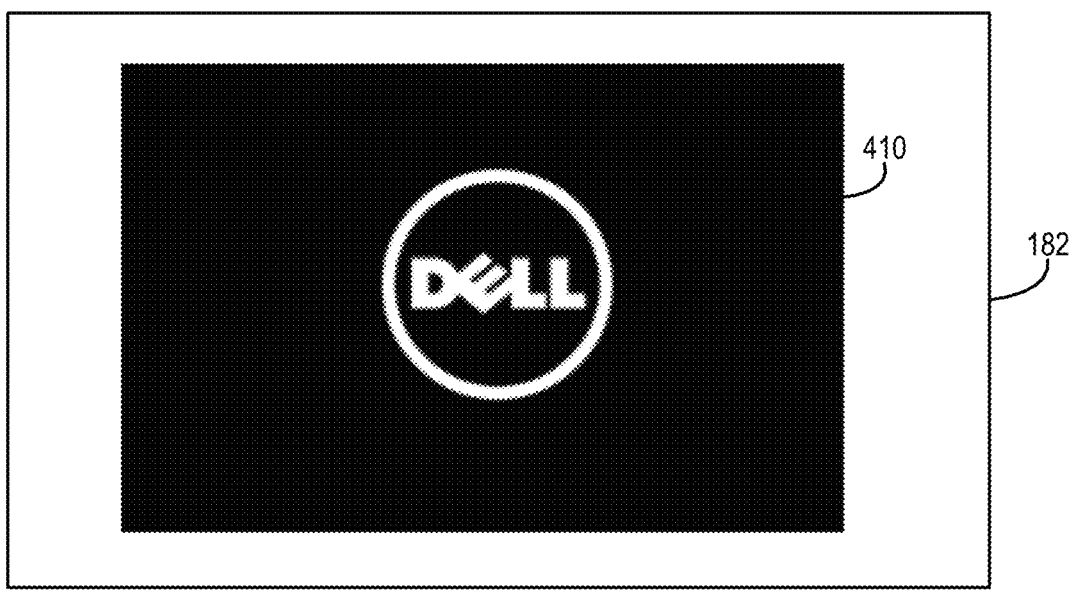
FIG. 4C illustrates an example of a display displaying an undistorted image, according to one or more embodiments.

In one or more embodiments, without barriers 450A-450F, display 182 may display an image 410 as distorted, as illustrated in FIG. 4B. In one or more embodiments, if an eye 193 is outside viewing volume 197, display 182 may display image 410 as distorted, as illustrated in FIG. 4B. In one or more embodiments, with barriers 450A-450F, display 182 may display image 410 as not distorted, as illustrated in FIG. 4C. In one or more embodiments, if an eye 193 is within viewing volume 197, display 182 may display image 410 as not distorted, as illustrated in FIG. 4C.

Figure 4D:
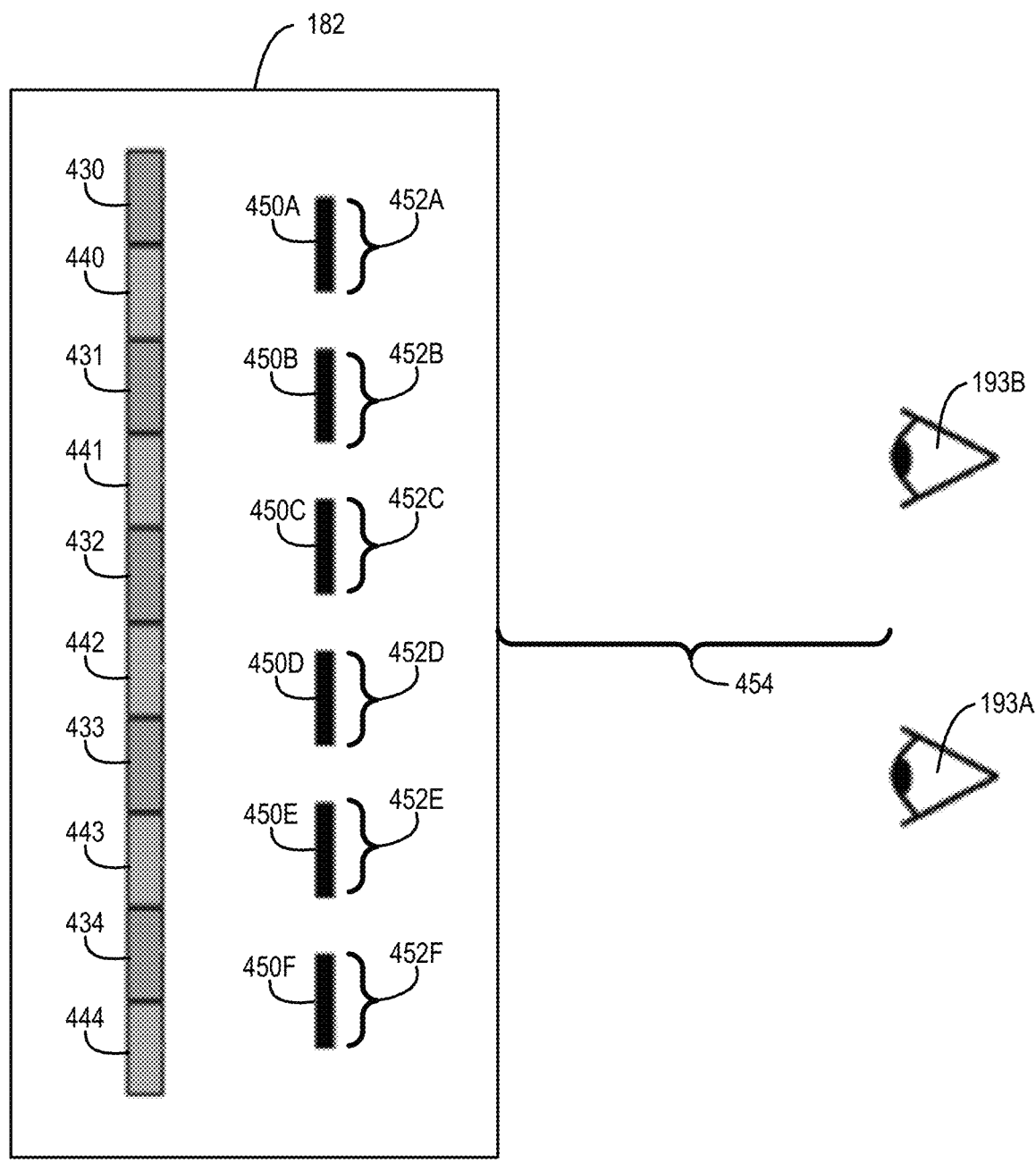
FIG. 4D illustrates an example of lengths of barriers, according to one or more embodiments.

Turning now to FIG. 4D, an example of lengths of barriers is illustrated, according to one or more embodiments. As shown, barriers 450A-450F may be respectively associated with length 452A-452F. In one example, two or more of lengths 452A-452F may be equal. For instance, a first length 452 may be equal to a second length 452. In another example, two or more of lengths 452A-452F may be different. For instance, a first length 452 may be different from a second length 452.

In one or more embodiments, a length 452 may be associated with a measurement. In one example, a measurement may be measured in millimeters. In another example, a measurement may be measured in a number of pixels. In one instance, the number of pixels may be a number of light emitting pixels. In another instance, the number of pixels may be a number of light blocking pixels.

As illustrated, eyes 193A and 193B of user 190 may be at a distance 454 from display 182. For example, distance 454 may be a distance from eyes 193A and 193B to gaze point 192. In one or more embodiments, one or more of lengths 452A-452F may be based at least on distance 454. For example, one or more of barriers 450A-450F may be determined and/or established based at least on distance 454. For instance, one or more of lengths 452A-452F may be determined and/or established based at least on distance 454.

Figure 4E:
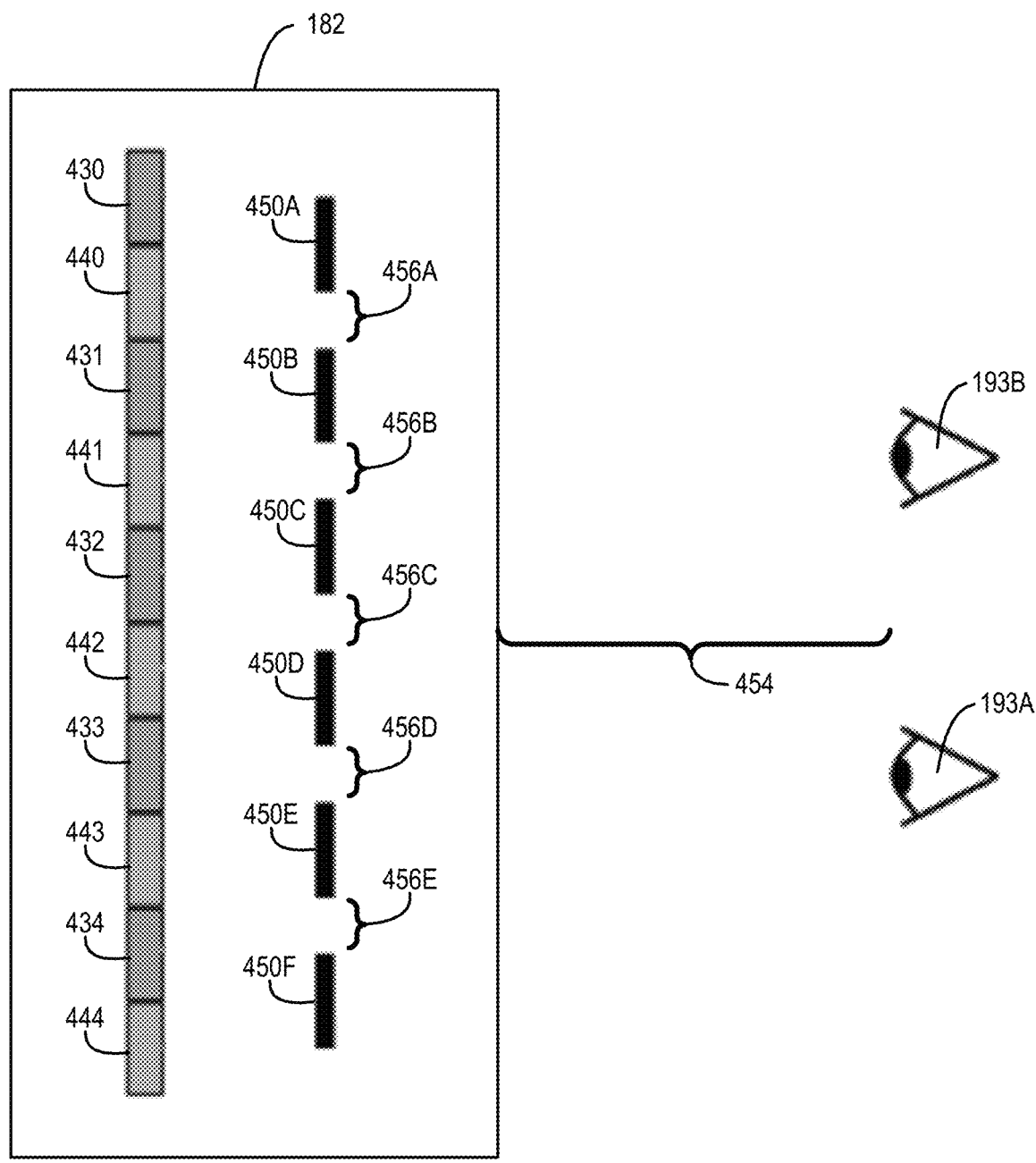
FIG. 4E illustrates an example of lengths of spaces between barriers, according to one or more embodiments.

Turning now to FIG. 4E, an example of lengths of spaces between barriers is illustrated, according to one or more embodiments. As shown, lengths of spaces between barriers 450A-450F may be respectively associated with lengths 456A-456E. In one example, two or more of lengths 456A-456E may be equal. For instance, a first length 456 may be equal to a second length 456. In another example, two or more of lengths 456A-456E may be different. For instance, a first length 456 may be different from a second length 456.

In one or more embodiments, a length 456 may be associated with a measurement. In one example, a measurement may be measured in millimeters. In another example, a measurement may be measured in a number of pixels. In one instance, the number of pixels may be a number of light emitting pixels. In another instance, the number of pixels may be a number of light blocking pixels.

As illustrated, eyes 193A and 193B of user 190 may be at distance 454 from display 182. For example, distance 454 may be a distance from eyes 193A and 193B to gaze point 192. In one or more embodiments, one or more of lengths 456A-456E may be based at least on distance 454. For example, one or more of barriers 450A-450F may be determined and/or established based at least on distance 454. For instance, one or more of lengths 456A-456E may be determined and/or established based at least on distance 454. In one or more embodiments, a length 456 may be a distance of a space between two barriers 450.

Figure 5A:
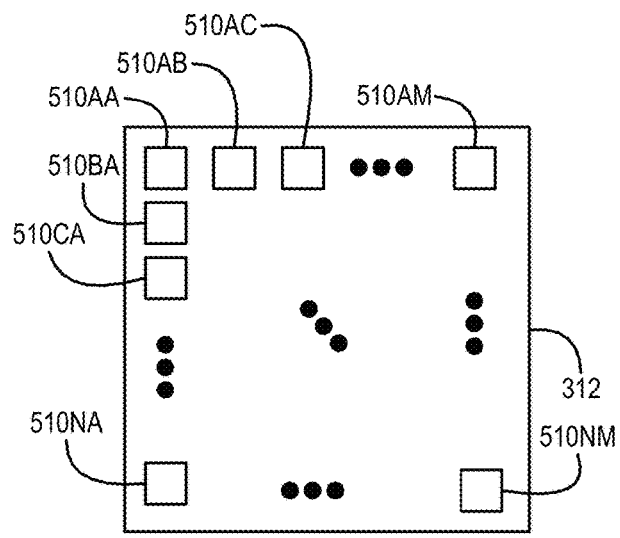
FIG. 5A illustrates an example of multiple liquid crystal display pixels, according to one or more embodiments.

Turning now to FIG. 5A, an example of multiple liquid crystal display pixels is illustrated, according to one or more embodiments. As shown, layer 312 may include LCD pixels 510AA-510NM. In one example, a first number of LCD pixels 510AA-510AN may be equal to a second number of LCD pixels 510AA-510AM. In another example, a first number of LCD pixels 510AA-510AN may be different from a second number of LCD pixels 510AA-510AM. In one or more embodiments, one or more of LCD pixels 510 may be utilized to establish one or more of barriers 450. In one or more embodiments, one or more of LCD pixels 510 may be utilized to block light emissions from one or more LED pixels. For example, one or more of LCD pixels 510 may be utilized to block light emissions from one or more organic light emitting diode (OLED) pixels.

Figure 5B:
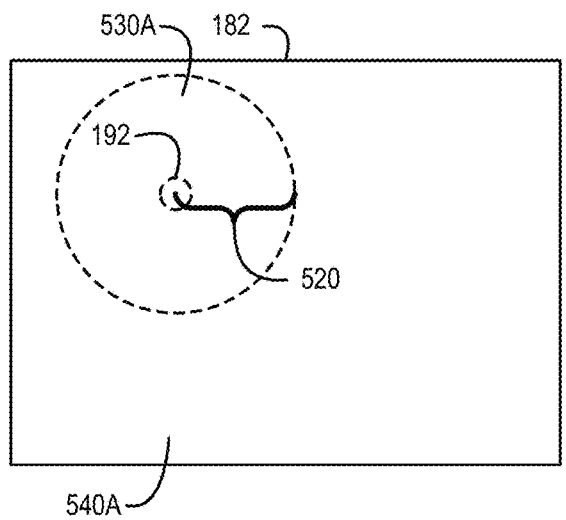
FIG. 5B illustrates an example of a viewing area, according to one or more embodiments.

Turning now to FIG. 5B, an example of a viewing area is illustrated, according to one or more embodiments. As shown, an area 530A may be within a distance 520 from gaze point 592. For example, glyphs, text, and/or graphics may be viewed by eyes 193A and 193B without distortion within area 530A. For instance, glyphs, text, and/or graphics may be viewed by eyes 193A and 193B without distortion within distance 520 from gaze point 592.

In one or more embodiments, glyphs, text, and/or graphics may be distorted within an area 540A, which is not within area 530A. For example, multiple LCD pixels 510 may be configured to distort glyphs, text, and/or graphics within area 540A. In one or more embodiments, multiple LCD pixels 510 may be configured to block light emissions. For example, multiple LCD pixels 510 may be configured to block light emissions from one or more light-emitting pixels of display 182 associated with area 540A. In one instance, multiple LCD pixels 510 may be configured to block light emissions from one or more LED pixels of display 182 associated with area 540A. In another instance, multiple LCD pixels 510 may be configured to block light emissions from one or more OLED pixels of display 182 associated with area 540A.

Figure 5C:
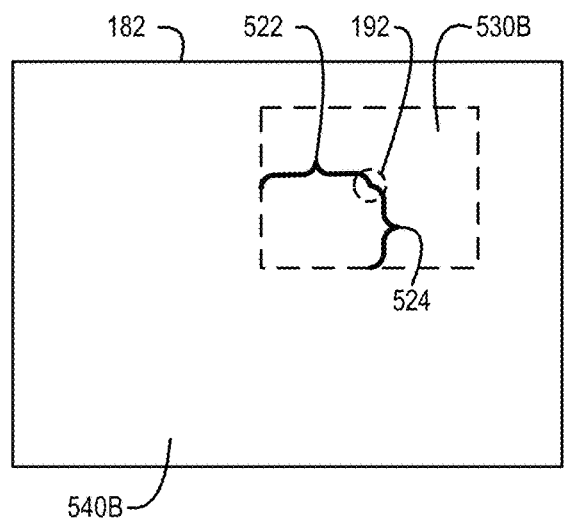
FIG. 5C illustrates another example of a viewing area, according to one or more embodiments.

Turning now to FIG. 5C, another example of a viewing area is illustrated, according to one or more embodiments. As shown, an area 530B may be within a distance 522 (associated with a vertical axis of display 182) from gaze point 592 and within a distance 524 (associated with a horizontal axis of display 182) from gaze point 592. For example, glyphs, text, and/or graphics may be viewed by eyes 193A and 193B without distortion within area 530B. For instance, glyphs, text, and/or graphics may be viewed by eyes 193A and 193B without distortion within distance 522 from gaze point 592 and within distance 524 from gaze point 592.

In one or more embodiments, glyphs, text, and/or graphics may be distorted within an area 540B, which is not within area 530B. For example, multiple LCD pixels 510 may be configured to distort glyphs, text, and/or graphics within area 540B. In one or more embodiments, multiple LCD pixels 510 may be configured to block light emissions. For example, multiple LCD pixels 510 may be configured to block light emissions from one or more OLED pixels of display 182 associated with area 540B.

In one or more embodiments, when one or more of a glyph, text and a graphic are distorted, the one or more of the glyph, the text and/or the graphic may not be legible. For example, distorting the one or more of the glyph, the text and the graphic may provide privacy in displaying the one or more of the glyph, the text and/or the graphic. For instance, when the one or more of the glyph, the text and/or the graphic are not legible, privacy in displaying the one or more of the glyph, the text and/or the graphic may be provided and/or may be enabled.

Figure 6:
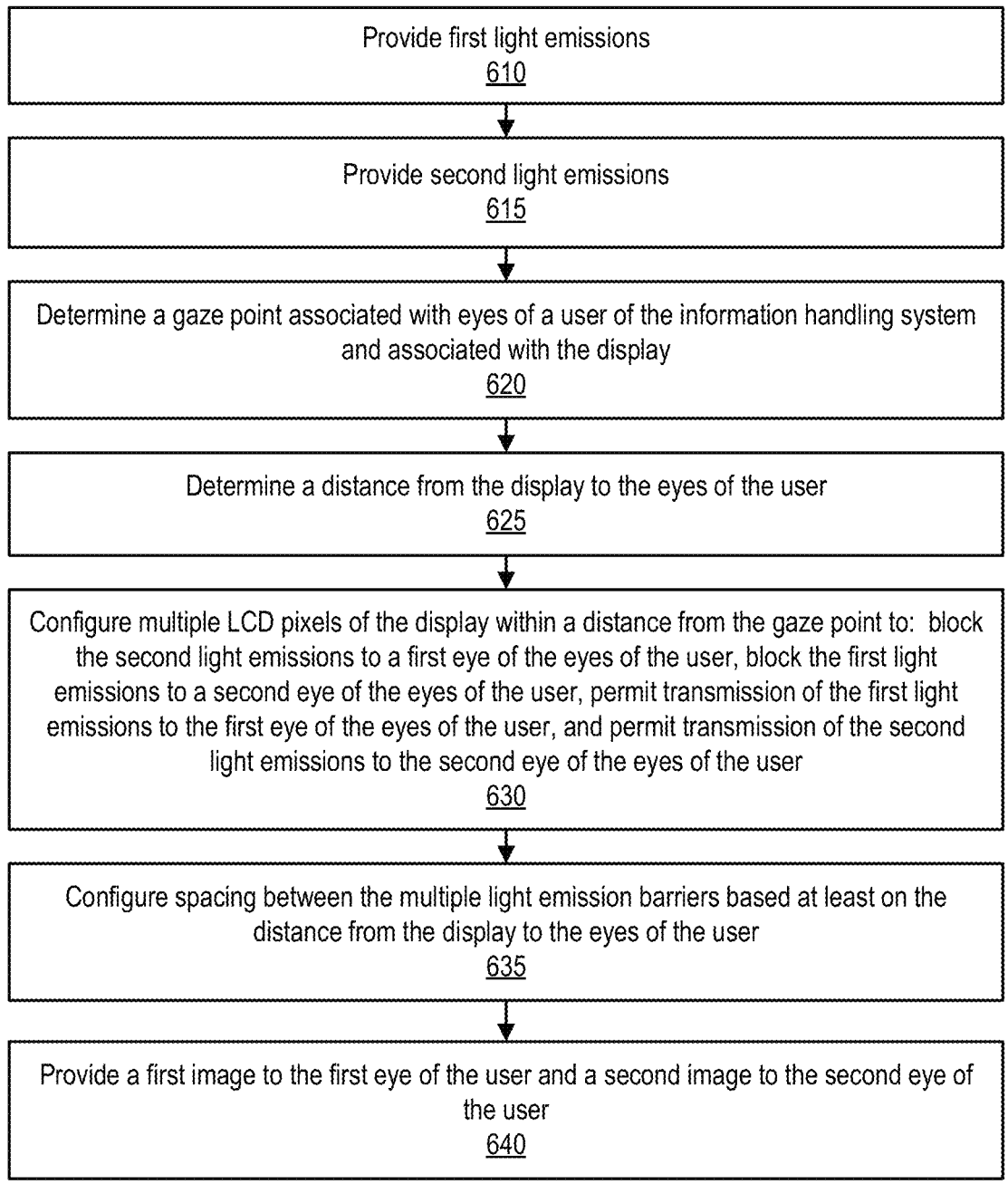
FIG. 6 illustrates an example of a method of operating a display, according to one or more embodiments.

Turning now to FIG. 6, an example of a method of operating a display is illustrated, according to one or more embodiments. At 610, first light emissions may be provided. For example, first multiple light emitting diode (LED) pixels of a display of an information handling system may provide first light emissions. In one or more embodiments, the first multiple LED pixels of the display may include first OLEDs. For example, pixels 430-434 may provide the first light emissions.

At 615, second light emissions may be provided. For example, second multiple LED pixels of the display of the information handling system may provide second light emissions. In one or more embodiments, the second multiple LED pixels of the display may include second OLEDs. For example, pixels 440-444 may provide the second light emissions. In one or more embodiments, method element 610 and 615 may be performed concurrently.

In one or more embodiments, a first layer of the display may include the first multiple LED pixels and the second multiple LED pixels. For example, a first layer of display 182 may include pixels 430-434 and pixels 440-444. In one instance, the first layer of display 182 may include one or more of layers 316 and 318, as illustrated in FIG. 3A. In another instance, the first layer of display 182 may include layer 319, as shown in FIG. 3B.

At 620, a gaze point associated with eyes of a user of the information handling system and associated with the display may be determined. For example, gaze point 192 may be determined. At 625, a distance from the display to the eyes of the user may be determined. For example, distance 454 may be determined. In one instance, distance 454 may be determined utilizing camera 182. In a second instance, distance 454 may be determined utilizing eye tracking device 191. In another instance, distance 454 may be determined utilizing a time of flight sensor (e.g., a SONAR (Sound Navigation And Ranging) device, a LIDAR (Light Detecting And Ranging) device, etc.).

At 630, multiple LCD pixels of the display within a distance from the gaze point may be configured to: block the second light emissions to a first eye of the eyes of the user, block the first light emissions to a second eye of the eyes of the user, permit transmission of the first light emissions to the first eye of the eyes of the user, and permit transmission of the second light emissions to the second eye of the eyes of the user.

In one example, multiple LCD pixels 510 of display 182 within distance 520 from gaze point 192 may be configured to: block the second light emissions to eye 193A, block the first light emissions to eye 193B, permit transmission of the first light emissions to eye 193A, and permit transmission of the second light emissions to eye 193B. In one instance, the multiple LCD pixels 510 may establish multiple barriers 450 within distance 520 from gaze point 192, which may block the second light emissions to eye 193A, block the first light emissions to eye 193B, permit transmission of the first light emissions to eye 193A, and permit transmission of the second light emissions to eye 193B. In another instance, the multiple LCD pixels 510 may establish multiple barriers 450 within area 530A, which may block the second light emissions to eye 193A, block the first light emissions to eye 193B, permit transmission of the first light emissions to eye 193A, and permit transmission of the second light emissions to eye 193B.

In another example, multiple LCD pixels 510 of display 182 within distance 522 from gaze point 192 and within distance 524 from gaze point 192 may be configured to: block the second light emissions to eye 193A, block the first light emissions to eye 193B, permit transmission of the first light emissions to eye 193A, and permit transmission of the second light emissions to eye 193B. In one instance, the multiple LCD pixels 510 may establish multiple barriers 450 within distance 522 from gaze point 192 and within distance 524 from gaze point 192, which may block the second light emissions to eye 193A, block the first light emissions to eye 193B, permit transmission of the first light emissions to eye 193A, and permit transmission of the second light emissions to eye 193B. In another instance, the multiple LCD pixels 510 may establish multiple barriers 450 within area 530B, which may block the second light emissions to eye 193A, block the first light emissions to eye 193B, permit transmission of the first light emissions to eye 193A, and permit transmission of the second light emissions to eye 193B.

In one or more embodiments, a second layer of the display may include the multiple LCD pixels. For example, a second layer of display 182 may include the multiple of LCD pixels 510. In one instance, the second layer of display 182 may include layer 312, illustrated in FIG. 3A. In another instance, the second layer of display 182 may include layer 312, illustrated in FIG. 3B.

At 635, spacing distances between the multiple light emission barriers may be configured based at least on the distance from the display to the eyes of the user. In one or more embodiments, configuring spacing distances between the multiple light emission barriers based at least on distance 454 from display 182 to eyes 193A and 193B may include determining one or more of lengths 456. In one example, as illustrated in FIG. 4E, barriers 450A and 450B may be spaced by length 456A. In a second example, as illustrated in FIG. 4E, barriers 450B and 450C may be spaced by length 456B. In a third example, as illustrated in FIG. 4E, barriers 450C and 450D may be spaced by length 456C. In a fourth example, as illustrated in FIG. 4E, barriers 450D and 450E may be spaced by length 456D. In another example, as illustrated in FIG. 4E, barriers 450E and 450F may be spaced by length 456E.

At 640, a first image may be provided to the first eye of the user, and a second image may be provided to the second eye of the user. For example, display 182 may concurrently provide a first image to eye 193A and a second image to eye 193B. For instance, the first multiple LED pixels may provide the first image, and the second multiple LED pixels may provide the second image. In one or more embodiments, the first image may be provided to the first eye of the user via the first light emissions, and the second image may be provided to the second eye of the user via the second light emissions.

In one or more embodiments, the multiple LCD pixels of the display may prevent the first image from being provided to the second eye of the user and may prevent the second image from being provided to the first eye of the user. For example, the multiple LCD pixels of the display establish barriers 450. For instance, the barriers may prevent the first image from being provided to the second eye of the user and may prevent the second image from being provided to the first eye of the user.

In one or more embodiments, one or more of the method and/or process elements and/or one or more portions of a method and/or a process element may be performed in varying orders, may be repeated, or may be omitted. Furthermore, additional, supplementary, and/or duplicated method and/or process elements may be implemented, instantiated, and/or performed as desired, according to one or more embodiments. Moreover, one or more of system elements may be omitted and/or additional system elements may be added as desired, according to one or more embodiments.

In one or more embodiments, a memory medium may be and/or may include an article of manufacture. For example, the article of manufacture may include and/or may be a software product and/or a program product. For instance, the memory medium may be coded and/or encoded with processor-executable instructions in accordance with at least a portion of one or more flowcharts, at least a portion of one or more systems, at least a portion of one or more methods, and/or at least a portion of one or more processes described herein to produce the article of manufacture.

The above disclosed subject matter is to be considered illustrative, and not restrictive, and the appended claims are intended to cover all such modifications, enhancements, and other embodiments which fall within the true spirit and scope of the present disclosure. Thus, to the maximum extent allowed by law, the scope of the present disclosure is to be determined by the broadest permissible interpretation of the following claims and their equivalents, and shall not be restricted or limited by the foregoing detailed description.

What is claimed is:

1. An information handling system, comprising:
at least one processor; and
a memory medium, coupled to the at least one processor, that stores instructions executable by the at least one processor, which when executed by the at least one processor, cause the information handling system to:
provide, by a first plurality of light emitting diode (LED) pixels of a display coupled to the at least one processor, first light emissions;
provide, by a second plurality of LED pixels of the display, second light emissions;
determine a gaze point associated with eyes of a user of the information handling system and associated with the display; and
configure a plurality of liquid crystal display (LCD) pixels of the display within a distance from the gaze point to: block the second light emissions to a first eye of the eyes of the user, block the first light emissions to a second eye of the eyes of the user, permit transmission of the first light emissions to the first eye of the eyes of the user, and permit transmission of the second light emissions to the second eye of the eyes of the user via establishing a plurality of light emission barriers that block the second light emissions to the first eye of the eyes of the user, block the first light emissions to the second eye of the eyes of the user, permit transmission of the first light emissions to the first eye of the eyes of the user, and permit transmission of the second light emissions to the second eye of the eyes of the user;
wherein a first layer of the display includes the first plurality of LED pixels and the second plurality of LED pixels; and
wherein a second layer of the display includes the plurality of LCD pixels.

2. The information handling system of claim 1, wherein the instructions further cause the information handling system to:
determine a distance from the display to the eyes of the user; and
configure spacing distances between the plurality of light emission barriers based at least on the distance from the display to the eyes of the user.

3. The information handling system of claim 1, wherein the second layer of the display is at least six millimeters (6 mm) thick.

4. The information handling system of claim 1,
wherein the first plurality of LED pixels include a first plurality of organic light emitting diode (OLED) pixels; and
wherein the second plurality of LED pixels include a second plurality of OLED pixels.

5. The information handling system of claim 4, wherein the first plurality of OLED pixels and the second plurality of OLED pixels are addressed via passive matrix addressing or via active matrix addressing.

6. The information handling system of claim 1,
wherein the first light emissions are polarized at a first angle;
wherein the second light emissions are polarized at the first angle;
wherein the first plurality of LCD pixels are configured to polarize the first light emissions at a second angle; and
wherein the second plurality of LCD pixels are configured to polarize the second light emissions at the second angle.

7. The information handling system of claim 1, further comprising:
the display.

8. A method, comprising:
providing, by a first plurality of light emitting diode (LED) pixels of a display coupled to at least one processor of an information handling system, first light emissions;
providing, by a second plurality of LED pixels of the display, second light emissions;
determining, by the information handling system, a gaze point associated with eyes of a user of the information handling system and associated with the display; and
configuring, by the information handling system, a plurality of liquid crystal display (LCD) pixels of the display within a distance from the gaze point to: block the second light emissions to a first eye of the eyes of the user, block the first light emissions to a second eye of the eyes of the user, permit transmission of the first light emissions to the first eye of the eyes of the user, and permit transmission of the second light emissions to the second eye of the eyes of the user via establishing a plurality of light emission barriers that block the second light emissions to the first eye of the eyes of the user, block the first light emissions to the second eye of the eyes of the user, permit transmission of the first light emissions to the first eye of the eyes of the user, and permit transmission of the second light emissions to the second eye of the eyes of the user;
wherein a first layer of the display includes the first plurality of LED pixels and the second plurality of LED pixels; and
wherein a second layer of the display includes the first plurality of LCD pixels and the second plurality of LCD pixels.

9. The method of claim 8, further comprising:
determining, by the information handling system, a distance from the display to the eyes of the user; and
configuring, by the information handling system, spacing distances between the plurality of light emission barriers based at least on the distance from the display to the eyes of the user.

10. The method of claim 8, wherein the second layer of the display is at least six millimeters (6 mm) thick.

11. The method of claim 8,
wherein the first plurality of LED pixels include a first plurality of organic light emitting diode (OLED) pixels; and
wherein the second plurality of LED pixels include a second plurality of OLED pixels.

12. The method of claim 11, wherein the first plurality of OLED pixels and the second plurality of OLED pixels are addressed via passive matrix addressing or via active matrix addressing.

13. The method of claim 8,
wherein the first light emissions are polarized at a first angle;

wherein the second light emissions are polarized at the first angle;

wherein the first plurality of LCD pixels are configured to polarize the first light emissions at a second angle; and wherein the second plurality of LCD pixels are configured to polarize the second light emissions at the second angle.

14. The method of claim 8, wherein the information handling system includes the display.

15. A computer-readable non-transitory memory medium that includes instructions that, when executed by at least one processor of an information handling system, cause the information handling system to:

provide, by a first plurality of light emitting diode (LED) pixels of a display coupled to the at least one processor, first light emissions;

provide, by a second plurality of LED pixels of the display, second light emissions;

determine a gaze point associated with eyes of a user of the information handling system and associated with the display; and configure a plurality of liquid crystal display (LCD) pixels of the display within a distance from the gaze point to: block the second light emissions to a first eye of the eyes of the user, block the first light emissions to a second eye of the eyes of the user, permit transmission of the first light emissions to the first eye of the eyes of the user, and permit transmission of the second light emissions to the second eye of the eyes of the user via establishing a plurality of light emission barriers that block the second light emissions to the first eye of the eyes of the user, block the first light emissions to the second eye of the eyes of the user, permit transmission of the first light emissions to the first eye of the eyes of the user, and permit transmission of the second light emissions to the second eye of the eyes of the user;

wherein a first layer of the display includes the first plurality of LED pixels and the second plurality of LED pixels; and wherein a second layer of the display includes the plurality of LCD pixels.

16. The computer-readable non-transitory memory medium of claim 15, wherein the instructions further cause the information handling system to:

determine a distance from the display to the eyes of the user; and configure spacing distances between the plurality of light emission barriers based at least on the distance from the display to the eyes of the user.

17. The computer-readable non-transitory memory medium of claim 15, wherein the second layer of the display is at least six millimeters (6 mm) thick.

18. The computer-readable non-transitory memory medium of claim 15, wherein the first plurality of LED pixels include a first plurality of organic light emitting diode (OLED) pixels; and wherein the second plurality of LED pixels include a second plurality of OLED pixels.

19. The computer-readable non-transitory memory medium of claim 15, wherein the first light emissions are polarized at a first angle;

wherein the second light emissions are polarized at the first angle;

wherein the first plurality of LCD pixels are configured to polarize the first light emissions at a second angle; and wherein the second plurality of LCD pixels are configured to polarize the second light emissions at the second angle.

20. The computer-readable non-transitory memory medium of claim 15, wherein the information handling system includes the display.

* * * * *